United States Patent [19]

Suzuki

[11] Patent Number: 5,777,724
[45] Date of Patent: Jul. 7, 1998

[54] APPARATUS AND METHOD FOR CONTROLLING SCANNING EXPOSURE OF PHOTOSENSITIVE SUBSTRATE

[75] Inventor: Kazuaki Suzuki, Kawasaki, Japan

[73] Assignee: Nikon Corporation, Tokyo, Japan

[21] Appl. No.: 727,761

[22] Filed: Oct. 8, 1996

Related U.S. Application Data

[63] Continuation of Ser. No. 481,824, Jun. 7, 1995, abandoned, which is a continuation of Ser. No. 294,981, Aug. 24, 1994, abandoned.

[30] Foreign Application Priority Data

Aug. 26, 1993 [JP] Japan .................................. 5-211246

[51] Int. Cl.$^6$ .......................... G03B 27/42; G03B 27/74; G03B 27/80
[52] U.S. Cl. .......................... 355/68; 355/53; 355/77
[58] Field of Search .................................. 355/53, 67, 68, 355/69, 71, 77

[56] References Cited

U.S. PATENT DOCUMENTS

| | | | |
|---|---|---|---|
| 3,538,828 | 11/1970 | Genovese | 95/18 |
| 4,822,975 | 4/1989 | Torigoe | 219/121.85 |
| 4,924,257 | 5/1990 | Jain | 355/53 |
| 4,970,546 | 11/1990 | Suzuki et al. | 355/53 |
| 5,097,291 | 3/1992 | Suzuki | 355/69 X |
| 5,191,374 | 3/1993 | Hazama et al. | 355/43 |
| 5,281,996 | 1/1994 | Bruning et al. | 355/77 |
| 5,289,231 | 2/1994 | Magome et al. | 355/53 |
| 5,343,270 | 8/1994 | Sakakibara et al. | 355/53 |
| 5,473,410 | 12/1995 | Nishi | 355/53 |
| 5,473,412 | 12/1995 | Ozawa | 355/53 X |

FOREIGN PATENT DOCUMENTS

| | | |
|---|---|---|
| 0 614 124 | 9/1994 | European Pat. Off. |
| 63-316430 | 12/1988 | Japan. |
| 2-135723 | 5/1990 | Japan. |

Primary Examiner—Fred Braun
Attorney, Agent, or Firm—Shapiro and Shapiro

[57] ABSTRACT

An exposure amount control device for controlling an integrated exposure amount of pulsed light to a photosensitive substrate within a predetermined range in which a pattern of a mask is successively exposed on the substrate by synchronously scanning the mask forming the pattern to be exposed and the photosensitive substrate relatively with respect to a predetermined illumination area illuminated with pulsed light from a pulsed light source, satisfies the following relationship:

$$\Delta D_{12} \geq D/(2N_{min})$$

wherein luminous intensity distribution of the predetermined illumination area in a scan direction is shaped to be a trapezoid, $\Delta D_{12}$ is an average value of half of the widths of the slope portions on the lateral sides of the trapezoid-shaped luminous intensity distribution in the scan direction, D is the width, at half peak value points, of the luminous intensity distribution on the predetermined illumination area of the substrate in the scan direction and $N_{min}$ is a minimum number of exposure pulses necessary for controlling an integrated exposure amount at respective points on the substrate within predetermined accuracy.

31 Claims, 4 Drawing Sheets

5,777,724

APPARATUS AND METHOD FOR CONTROLLING SCANNING EXPOSURE OF PHOTOSENSITIVE SUBSTRATE

This is a continuation of application Ser. No. 08/481,824 filed Jun. 7, 1995, which is a continuation of application Ser. No. 08/294,981 filed Aug. 24, 1994, both now abandoned.

BACKGROUND OF THE INVENTION

1. Field of the Invention

The present invention relates to an exposure amount control device suitably applied to a slit scan type exposure apparatus for controlling an exposure amount and uniformity of luminous intensity to a photosensitive substrate within a predetermined range wherein a pattern of a mask is exposed on the photosensitive substrate by synchronously scanning the mask and the photosensitive substrate with respect to, e.g., a rectangular or circular illumination area illuminated with a pulsed light source as an exposure light source.

2. Related Background Art

In manufacturing semiconductors, liquid crystal display devices or thin film magnetic heads, etc. under photolithography technique, projection exposure apparatuses have been utilized in which the pattern of a photomask or a reticle (hereinafter called as "the reticle") is exposed via a projection optical system on a photosensitive substrate such as a wafer with photoresist applied thereto, a glass plate or the like. Recently, a chip pattern of a semiconductor, etc. tends to become large and in the projection exposure apparatus, it is required to expose a larger portion of the pattern of a reticle on the photosensitive substrate.

Also, as the pattern of a semiconductor, etc. becomes minute, improvement of resolution of the projection optical system is required. In order to improve the resolution of the projection optical system, the exposure field of the projection optical system needs to be enlarged, which is difficult in respect to the design or manufacture. Especially, when using a reflective and refractive system as the projection optical system, there is a case that the shape of the exposure field with no aberration happens to be circular.

In order to deal with the problems of the tendency of enlargement of the pattern to be exposed and the limitation of the exposure field of the projection optical system, a so-called slit scan type projection exposure apparatus has been developed in which the pattern of a reticle larger than a slit-shaped illumination area on the reticle is exposed on a photosensitive substrate by synchronously scanning the reticle and the photosensitive substrate with respect to, e.g., a rectangular, circular or hexagonal illumination area (hereinafter called as "the slit-shaped illumination area"). Generally, in the projection optical apparatus, the condition of a proper exposure amount and uniformity of luminous intensity with respect to a photosensitive material of the photosensitive substrate is determined. Therefore, the slit scan type projection exposure apparatus is also provided with an exposure amount control device which makes an exposure amount to the photosensitive substrate coincide with a proper exposure amount within a predetermined allowable range and maintains the uniformity of the luminous intensity of exposure light to the wafer within a predetermined level.

Also, recently, it is required to enhance the resolution of the pattern to be exposed on the photosensitive substrate. A method for enhancing the resolution is to use shortwave exposure light. Among presently usable light sources, an excimer laser light source, a pulsed oscillation type laser source (pulsed light source) such as a metallic vaporization laser light source or the like emits shortwave exposure lights. However, the exposure energies (light amounts) of the pulsed light emitted from the pulsed light source, different from the continuous light emission type light source such as a mercury lamp or the like, are fluctuated for the respective pulses within a predetermined range.

Consequently, in the conventional exposure amount control device, when the average pulsed light amount of pulsed light emitted from a pulsed light source on the photosensitive substrate is <p> and the range of the fluctuations of the light amounts of the pulsed light is Δp, the parameter Δp/<p> representing the fluctuations of the light amounts of the pulsed light is deemed to become a normal distribution (actually random). When the number of light pulses emitted to a certain area including a predetermined width in the scan direction (pulsed light integrated area) on the photosensitive substrate which is scanned relatively with respect to an exposure area conjugate to the slit-shaped illumination area is N, the exposure amount control device is controlled such that the integrated exposure amount reaches a proper exposure amount within a predetermined allowable range by using the fact that the fluctuations of the integrated exposure amount after the end of exposure becomes $(\Delta p/<p>)/N^{1/2}$.

Also, as disclosed in U.S. Pat. No. 4,822,975, when performing exposure by a method in which positions of the photosensitive substrate and the reticle are measured and the light emission trigger is sent to the pulsed light source synchronously with the result of the measurement, fluctuations of light emitting time (positions) may occur when, after performance of actual measurement in the measurement unit (laser interferometer or the like), the result of the measurement is outputted as a factor of the exposure apparatus.

Such fluctuations of light emitting positions can occur both in a large area and in a small area of the integrated exposure amount locally on the photosensitive substrate after scan and exposure. Because if light intensity on the slit-shaped illumination area arises from 0 to 100% in a step function on the adjacent non-illumination area, the width of the slit-shaped exposure area on the photosensitive substrate in the scan direction is represented by D and pulsed light emission is performed each time when the photosensitive substrate moves by D in the scan direction (which corresponds to the case that the number N of pulses illuminated on the pulse number integrated area is 1), the integrated exposure amount on joint portions between the adjacent pulse number integrated area can become double or 0 depending on positioning accuracy of the photosensitive substrate.

Thus, regarding the case that pictures (chip patterns) are joined in the non-scan direction by using a light source continuously emitting such as a mercury lamp or the like (which corresponds to the case that the number N of pulses using the pulsed light source in the scan direction is 1), there is disclosed a method in U.S. Pat. No. 3,538,828 in which the light intensity distribution in the non-scan direction (i.e., the direction of joining pictures), which integrates the slit-shaped exposure area in the scan direction, is formed to be an equal-legs stand shape. This method is adopted to the case that the number N of pulses illuminated at each point on the photosensitive substrate is 1 so that the inconvenience of which the integrated exposure amount fluctuates on the joint can be reduced. Although it is actually apparent from the disclosure of the U.S. Pat. No. 3,538,828, that there is also disclosed another method in U.S. Pat. No. 4,822,975 such that the luminous intensity distribution in the direction of joining pictures (in the scan direction) is formed to be an isosceles triangle or an equal-legs stand shape.

In the prior art described above, it is possible qualitatively to correspond to only when the value of the width of the light intensity on the slit-shaped illumination area in the scan direction and the distance of the light emitting position are equal to each other (when the number N of pulses on the pulse number integrated area is 1), a condition for obtaining a desired exposure amount and the uniformity of luminous intensity has not been revealed. Also, when performing exposure such that the number N of pulses is more than 2 and a plurality of pulses are overlapped on each pulse number integrated area of the photosensitive substrate, the condition for obtaining a desired exposure amount and the uniformity of luminous intensity has not been clear.

SUMMARY OF THE INVENTION

It is an object of the present invention to provide an exposure amount control device and method in which a desired exposure amount or uniformity of luminous intensity can be usually obtained on a photosensitive substrate when the device is applied to a slit scan type exposure apparatus with use of a pulsed light source.

In the exposure amount control device and method according to the present invention for controlling an integrated exposure amount of pulsed light to a photosensitive substrate within a predetermined range in which a pattern of a mask is successively exposed on the substrate by synchronously scanning the mask forming the pattern to be exposed and the photosensitive substrate with respect to a predetermined illumination area illuminated with pulsed light from a pulsed light source, when luminous intensity distribution of the predetermined illumination area in a scan direction is shaped to be a trapezoid, an average value of the widths at half peak value points slope portions on the lateral sides of the trapezoid-shaped luminous intensity distribution in the scan direction is represented by $\Delta D_{12}$, width at the half peak value points of the luminous intensity distribution on the predetermined illumination area of the substrate in the scan direction is represented by D and the minimum number of exposure pulses necessary for controlling an integrated exposure amount at respective points on the substrate within predetermined accuracy is represented by $N_{min}$, the device satisfies at least the following condition as a necessary condition.

$$\Delta D_{12} \geq D/(2N_{min}) \quad (A)$$

In this case, when the widths at the half peak value points, of the slope portions on the lateral sides of the luminous intensity distribution of the predetermined illumination area on the substrate in the scan direction are respectively represented by $\Delta D_1$ and $\Delta D_2$, and an allowable value of the unevenness of luminous intensity on the substrate in the scan direction is represented by $[U_{Scan}]_{max}$, it is also desirable to meet the following condition.

$$|(1/\Delta D_1)-(1/\Delta D_2)| \leq 2N_{min} \cdot 3[U_{scan}]_{max}/\Delta D_{12} \quad (B)$$

Further, it is possible to make the luminous intensity distribution on the predetermined illumination area of the substrate shape a trapezoid by defocussing a field stop for illuminating the predetermined illumination area in a predetermined amount from a position optically conjugate to an exposure surface of the substrate.

According to the present invention, the luminous intensity distribution on the predetermined illumination area (slit-shaped illumination area) of the substrate is shaped to be a trapezoid. The width at the half peak value points, of the trapezoid-shaped luminous intensity distribution on the substrate in the scan direction (width between points each of which is at half the maximum value of the luminous intensity) is represented by D and the widths at the peak value points, the slope portions (edge portions) of the luminous intensity distribution in the scan direction are respectively represented by $\Delta D_{12}$ and $\Delta D_2$. Then when the average value $\Delta D_{12}$ of $\Delta D_1$ and $\Delta D_2$ meets the condition (A) as the necessary condition, entire points on the substrate are exposed at least for a pulse on the slope portions (edge portions) of the luminous intensity distribution, so that fluctuations of the integrated exposure amount in the scan direction (deterioration of the uniformity of luminous intensity) can be maintained to be less than exposure energy for a pulse.

Although the condition (A) is given as to the average $\Delta D_{12}$ of $\Delta D_1$ and $\Delta D_2$, another predetermined condition is also required as to the proportion (symmetry). That is, if the width $\Delta D_1$ of half the slope portion on one side is, for example, unusually small and the width $\Delta D_2$ of half the slope portion on the other side is large when only the average value $\Delta D_{12}$ has been defined, fluctuations of the integrated exposure amount in the scan direction may occur. Then, the condition (B) as to the symmetry of the widths $\Delta D_1$ and $\Delta D_2$ is given, so that the fluctuations of the integrated exposure amount in the scan direction (unevenness of luminous intensity distribution) can be maintained to be equal to or less than $[U_{Scan}]_{max}$.

Also, when the luminous intensity distribution on the predetermined illumination area of the substrate is shaped to be a trapezoid by defocussing a field stop for illuminating the predetermined illumination area in a predetermined amount from a position optically conjugate to an exposure surface of the substrate, the average value $\Delta D_{12}$ can be set to a desired value with a simple structure. Further, the values $\Delta D_1$ and $\Delta D_2$ are equal to each other, so that the symmetry thereof can be preferably obtained.

DETAILED DESCRIPTION OF THE PREFERRED EMBODIMENTS

An embodiment of the present invention will be described with reference to the accompanied drawings. In this embodiment, the present invention is applied to an exposure amount control system of a slit scan type projection exposure apparatus which has a pulse oscillation type light source such as an excimer laser light source.

Figure 1:
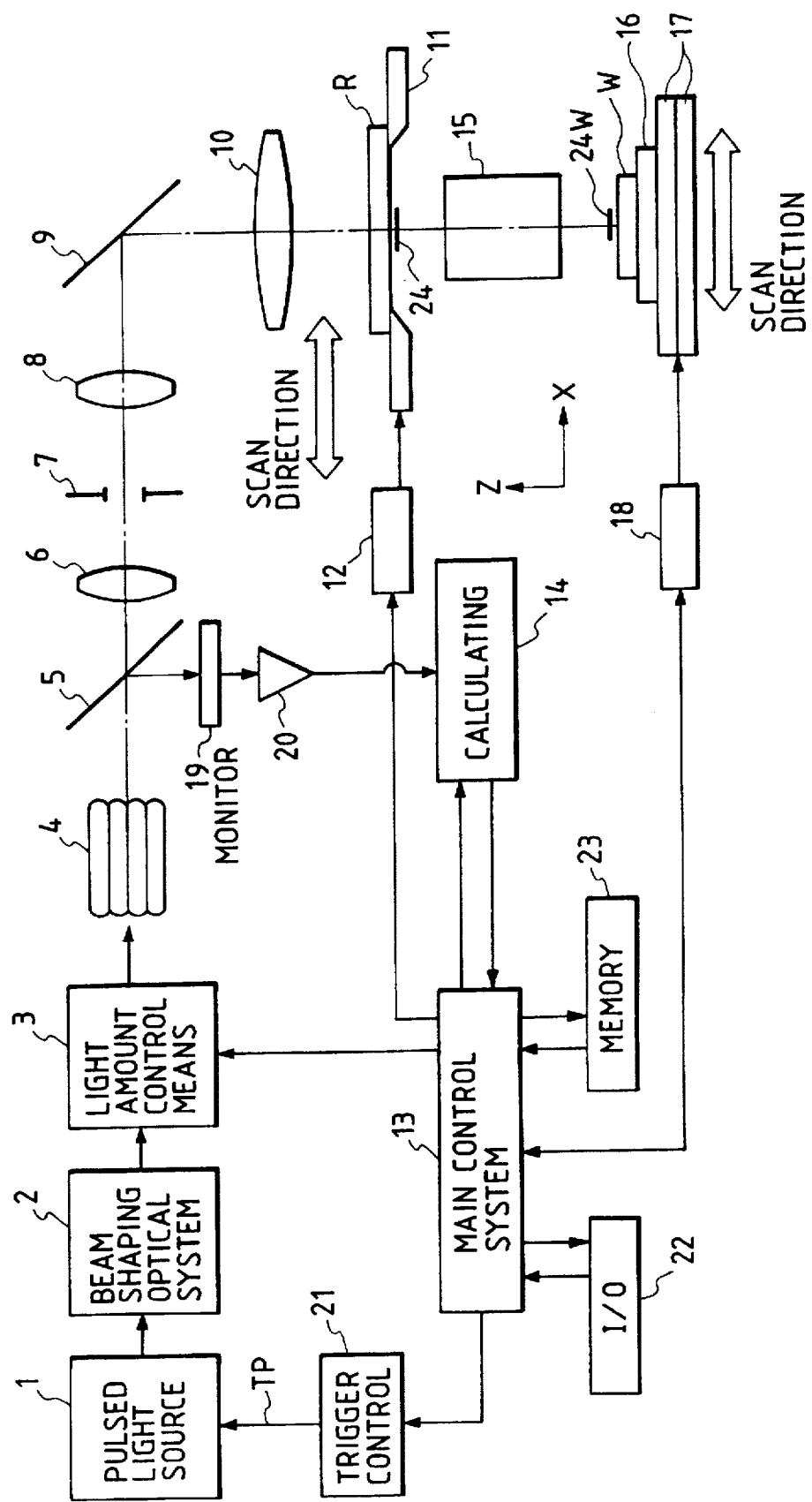
FIG. 1 is a schematic diagram showing the construction of a slit scan type projection exposure apparatus of an embodiment according to the present invention.

FIG. 1 shows the projection exposure apparatus of the embodiment. In FIG. 1, a laser beam emitted from a pulse oscillation type pulsed light source 1 is shaped in the cross section thereof by a beam shaping optical system 2 consisting of cylindrical lenses or a beam expander so as to be incident on a fly eye lens 4 efficiently. The laser beam emanating from the beam shaping optical system 2 enters a light amount control means 3 which has a coarse control portion and a fine control portion for controlling the transmittance. The laser beam emitted from the light amount control means 3 goes to the fly eye lens 4 which is provided for illuminating a field stop 7 and a reticle R disposed in succession after the fly eye lens 4 with uniform luminous intensity.

The laser beam from the fly eye lens 4 enters a beam splitter 5 with a small reflectance and a large transmittance. The laser beam passed through the beam splitter 5 illuminates the field stop 7 with uniform luminous intensity by means of a first relay lens 6. In this embodiment, the shape of the opening portion of the field stop 7 is rectangular.

The laser beam passed through the field stop 7 is incident via a second relay lens 8, a bending mirror 9 and a condenser lens 10 on the reticle R on a reticle stage 11 so as to illuminate the reticle R with uniform luminous intensity. The field stop 7, the pattern formed surface of the reticle R and the exposure surface of a wafer W are conjugate. And, the laser beam passing through the reticle R enters a rectangular slit-shaped illumination area 24 which is conjugate with the opening portion of the field stop 7 and disposed on the reticle R. It is possible to adjust the configuration of the slit-shaped illumination area 24 by changing that of the opening portion of the field stop 7 by means of a drive section (not shown).

A portion of the pattern of the reticle R corresponding to the slit-shaped illumination area 24 is projected and exposed on a portion of the wafer W via a projection optical system 15. A slit-shaped area 24W of the wafer W is conjugate with respect to the slit-shaped illumination area 24 and the projection optical system 15. Then, when the Z-coordinate is defined parallel to the optical axis of the projection optical system 15 and the scan direction of the reticle R with respect to the slit-like illumination area 24 within a plane perpendicular to the optical axis is set to be the X direction, the reticle stage 11 is scanned by a reticle stage driving unit 12 in the X direction. The reticle stage driving unit 12 is controlled by a main control system 13 for controlling the entire operation of the apparatus. Also, the reticle stage driving unit 12 is provided therein with a length measurement device (laser interferometer or the like) for detecting an X-coordinate in the X direction of the reticle stage 11, so that the measured X-coordinate of the reticle stage 11 is supplied to the main control system 13.

On the other hand, the wafer W is disposed via a wafer holder 16 on an XY stage 17 which can be scanned at least in the X direction (the lateral direction in FIG. 1). Also, a Z stage (not shown) for positioning the wafer W in the Z direction or the like is disposed between the XY stage 17 and the wafer holder 16. In the slit scan exposure, when the reticle R is scanned in the +X direction (or −X direction), the wafer W is scanned synchronously in the −X direction (or +X direction) with respect to the exposure area 24W by means of the XY stage 17. The main control system 13 controls the operation of the XY stage 17 via a wafer stage driving unit 18. The wafer stage driving unit 18 is provided therein with a length measurement device (laser interferometer or the like) for detecting a Y-coordinate in the Y direction of the XY stage 17, so that the measured Y-coordinate of the XY stage 17 is supplied to the main control system 13.

The laser beam reflected from the beam splitter 5 is received by an exposure light amount monitor 19 formed of a photoelectric converter device. A photoelectric converting signal from the exposure light amount monitor 19 is sent to a calculating unit 14 via an amplifier 20. The relationship of the photoelectric converting signal and the luminous intensity of the pulsed light on the exposure surface of the wafer W is obtained in advance. That is, the photoelectric converting signal of the exposure light amount monitor 19 is calibrated in advance.

The calculating unit 14 measures fluctuations of the light amounts of the pulsed light emitted from the pulsed light source 1 and emission timing of the respective light pulses by photoelectric converting signals from the exposure light amount monitor 19. The fluctuations of the light amounts of the pulsed light as well as the fluctuations of the emission timing of the light pulses are supplied to the main control system 13. Also, at the time of each exposure, the calculating unit 14 integrates the photoelectric converting signal for each of light pulses to obtain the integrated exposure amount to the wafer W. Then, the calculating unit 14 supplies the integrated exposure amount to the main control system 13.

The main control system 13 supplies a light emission trigger signal TP to the pulsed light source 1 via a trigger controller 21 to control the light emission timing of the pulsed light source 1. Also, based on the timing of supplying light emission trigger signals TP via the trigger controller 21 to the pulsed light source 1 and the receiving timing detected by the calculating unit 14, the calculating unit 14 calculates the fluctuations of periods when the pulsed light source 1 actually emits a light pulses after each light emission trigger is supplied to the pulsed light source 1, i.e., the fluctuations of the light emission timing of the pulsed light source 1. Further, the main control system 13 controls the output power of the pulsed light source 1 or the transmittance of the light amount control means 3 as required. An operator can input various information such as the information of the pattern of the reticle R or the like to the main control system 13 via an input/output means 22. The main control system 13 is equipped with a memory 23 for storing such various information.

Also, as mentioned in U.S. patent application Ser. No. 08/209,269 by the applicant of the present invention, filed on Mar. 14, 1994, when performing exposures by use with the pulsed light source in the slit scan exposure method, the fluctuations of the light emission timing of the pulsed light source to the positions of the photosensitive substrate (hereinafter called as "the fluctuations of the light emitting positions") cause the fluctuations of the integrated exposure amount. The fluctuations of the light emitting positions are caused, as a factor of the light source, by the fluctuations of periods when the light pulse source actually emits a pulsed light each time after a light emission trigger signal is sent to the pulsed light source. On the other hand, as mentioned in the U.S. patent application Ser. No. 08/209,269, when performing exposures by a method in which the substrate and the reticle are scanned synchronously at constant speed and light emission trigger signals are sent to the light source at constant time intervals, the fluctuations of the light emitting positions are caused, as a factor of the exposure apparatus, by uneven scan speed.

Figure 2:
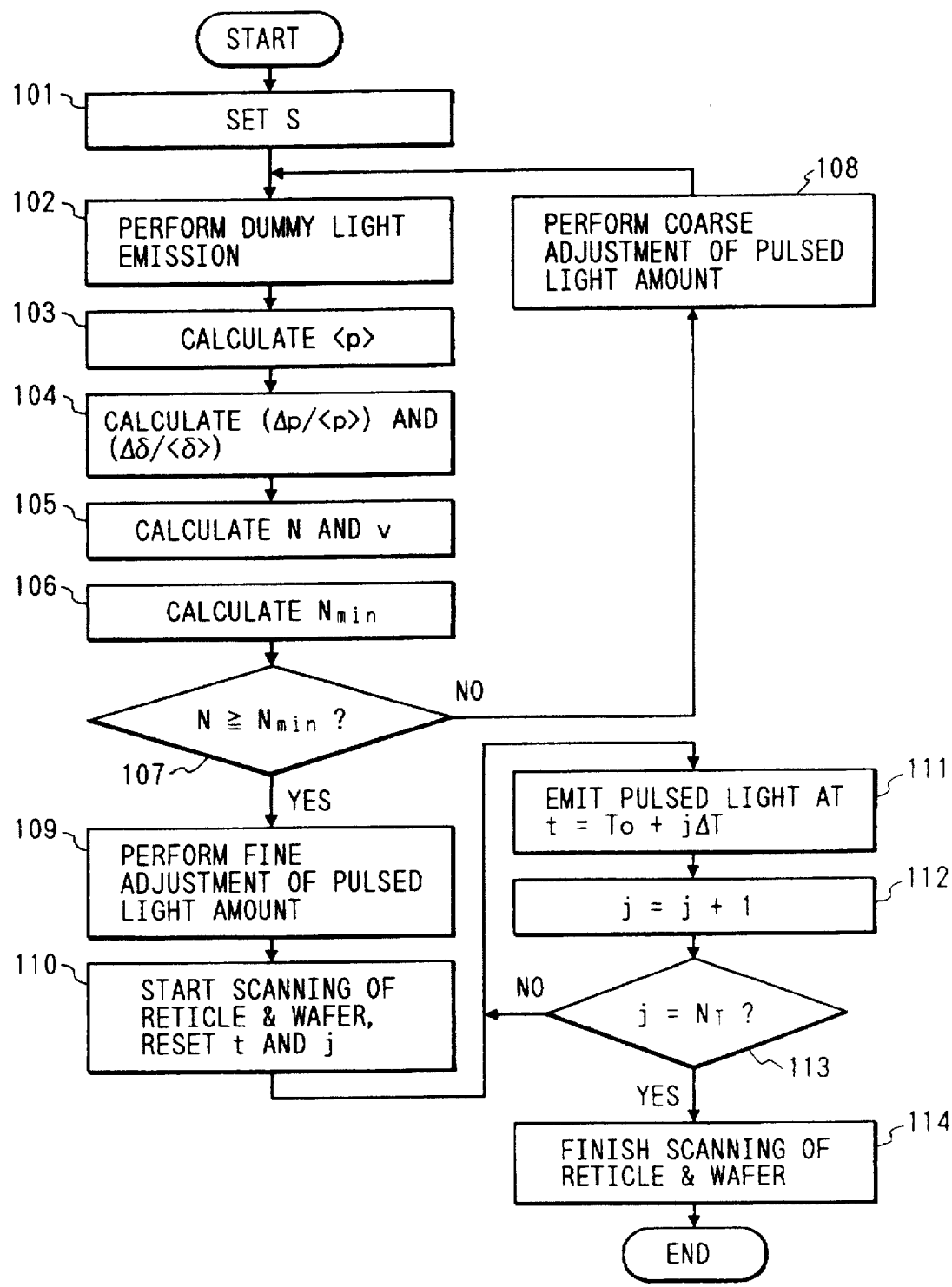
FIG. 2 is flow chart showing the exposure operation of the apparatus of FIG. 1.

Next, a method for reducing such fluctuations and uneven speed will be described hereinafter. FIG. 2 is a flow chart showing an operation for exposing a pattern of the reticle R on the wafer W according to the embodiment. First, in the step 101 of FIG. 2, the operator sets a desired exposure amount S (mJ/cm$^2$) on the surface of the wafer W to the main control system 13 via the input/output means 22. Next, in the step 102, the main control system 13 imparts instructions for dummy light emission to the trigger controller 21. Then, with the wafer W moved to the area where the wafer W will not be exposed (area outside the exposure area 24W), the experimental light emission (dummy light emission) of the pulsed light source 1 is performed. In the dummy light emission, pulsed light for, e.g., about 100 pulses is emitted. The distribution of the pulsed light amounts and the distribution of the light emission timing, both of which are known from the photoelectric converting signals detected in the exposure light amount monitor 19, become approximately normal distributions as shown in FIGS. 3A and 3B.

Figure 3A:
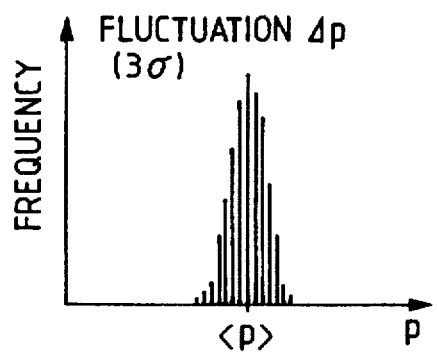
FIG. 3A is a graph showing the distribution of the light amounts of pulsed light.
Figure 3B:
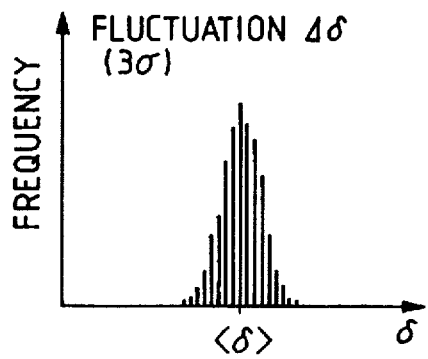
FIG. 3B is a graph showing the distribution of the light emission timing.

FIG. 3A shows the distribution of the values (mJ/cm$^2$) of the light amounts p (reduced values to the exposure surface of the wafer W) of the respective light pulses measured in the dummy light emission, while FIG. 3B shows the distribution of the light emission timing $\delta$ (sec) of the pulsed light source 1 measured in the dummy light emission. Then, in the step 103, the calculating unit 14 obtains the average pulsed light amount <p> (mJ/cm$^2$·pulse) on the exposure surface of the wafer W from the distribution data of the pulsed light amounts p shown in FIG. 3A and the average value <$\delta$> of the fluctuations of the light emission timing from the distribution data of the light emission timing $\delta$ shown in FIG. 3B.

Thereafter, in the step 104, the calculating unit 14 obtains the deviations $\Delta p$ of the pulsed light amounts at three times the standard deviation (3τ) from the distribution data of the pulsed light amounts p shown in FIG. 3A and the deviations $\Delta\delta$ of the light emission timing at three times the standard deviation from the distribution data of the light emission timing $\delta$ shown in FIG. 3B. Then, the calculating unit 14 calculates the fluctuations ($\Delta p/<p>$) of the pulsed light amounts and the fluctuations ($\Delta\delta/<\delta>$) of the light emission timing.

Next, in the step 105, the desired exposure amount S (mJ/cm$^2$) specified via the input/output means 22 is sent from the main control system 13 to the calculating unit 14, which then calculates the number N of exposure pulses by use of the desired exposure amount S and the average pulsed light amount <p> calculated in the step 103 from the following equation:

$$N = \text{int}(S/<p>) \quad (1)$$

wherein int (A) represents the integer obtained by discarding the decimal fraction of the real number A.

Also, the main control system 13 sends the information such as the width D (cm) of the slit-shaped exposure area 24W on the wafer W in the scan direction and the oscillation frequency f (Hz) of the pulsed light source 1 from the memory 23 to the calculating unit 14. Then, the calculating unit 14 obtains the scan speed v (cm/sec) on the surface of the wafer by use with the number N of exposure pulses, the width D and the frequency f calculated in the equation (1) from the following equation:

$$v = \frac{D \cdot f}{N} \quad (2)$$

Thereafter, in the step 106, the calculating unit 14 calculates the minimum number $N_{min}$ of the exposure pulses which is necessary for controlling the integrated exposure amount and the uniformity of the luminous intensity on the exposure surface of the wafer W within predetermined accuracy. The equation for calculating the minimum number $N_{min}$ of the exposure pulses will be described in detail later.

The number N of exposure pulses and the minimum number $N_{min}$ of the exposure pulses are supplied to the main control system 13.

In addition, when the fluctuations ($\Delta p/<p>$) of the pulsed light amount and the deviations $\Delta\delta$ of the light emission timing are both small, by obtaining the minimum number $N_{min}$ of the exposure pulses from the fluctuations ($\Delta p/<p>$) of the pulsed light amount and the deviations $\Delta\delta$ of the light emission timing to store the obtained minimum number $N_{min}$ of the exposure pulses in the memory 23 in advance, the minimum number $N_{min}$ of the exposure pulses may be read out from the memory 23 in the step 106 with omission of the operation of the step 104.

Next, in the step 107, the main control system 13 compares the number N of the exposure pulses with the minimum number Nmin of the exposure pulses. When N<$N_{min}$ holds as the result of the comparison, the main control system 13 lowers the transmittance of the light amount control means 3 (coarse adjustment) shown in FIG. 1 as in the step 108. Thereafter, the steps 102 to 107 are repeated and the number N of the exposure pulses is again compared with the minimum number Nmin of the exposure pulses. Accordingly, the transmittance of the light amount control means 3 is set such that N is equal to or more than $N_{min}$ holds finally. As an example of means for performing the coarse adjustment of the transmittance, there is a device formed by mounting a plurality of ND filters with different transmittances to a turret plate, as disclosed in Japanese Patent Application Laid-Open No. 63-316430 and U.S. Pat. No. 4,970,546.

Next, when N is equal to or more than $N_{min}$ in the step 107, the fine adjustment of pulsed light amounts is performed in the step 109. That is, the average pulsed light amount <p> is finely adjusted such that S/<p> in the equation (1) becomes an integer. At this time, since the scan speed v has been determined in accordance with the number N of exposure pulses obtained from the equation (1) in the step 105, it is preferable to adjust the pulsed light amounts finely so as not to change the number N of exposure pulses. i.e., so as to make the average pulsed light amount <p> slightly larger. On the other hand, if the average pulsed light amount <p> becomes slightly smaller by the fine adjustment of the pulsed light amounts so that the number N of exposure pulses becomes N+1, the scan speed v should be calculated again by the equation (2).

As an example of the fine adjusting means for adjusting pulsed light energies finely, there is means with two gratings which are disposed along the optical light path of pulsed light and formed with respective line and space patterns arranged at the same pitch and a mechanism for moving the two gratings slightly laterally with respect to each other, as disclosed in Japanese Patent Application Laid-Open No. 2-135723 (U.S. patent application Ser. No. 07/438,091, filed on Nov. 16, 1989). When utilizing these two gratings, pulsed light in areas where bright portion of the first grating overlap with those of the second grating is directed to the wafer W. Therefore, it is possible to regulate the amounts of pulsed light directed toward the wafer W finely by controlling the relative lateral moving amount of the two gratings.

Thereafter, in the step 110, the main control system 13 starts scanning the reticle R and the wafer W via the reticle stage 11 and the XY stage 17 under the wafer W. In FIG. 1, e.g., when the reticle R is scanned in the X direction, the wafer W is scanned in the −X direction. Also, although the scan speed v of the reticle R and the wafer W is determined by the equation (2) in this embodiment, the time for making the scan speed of the XY stage 17 under the wafer W reach the scan speed v after the start of scanning is set to be $T_0$.

In this embodiment, the light emission triggers of the pulsed light source 1 are emitted at constant time intervals as disclosed in U.S. patent application Ser. No. 08/209,269. Then, after resetting the time t and the parameter j to zero at the time of the start of scanning, and when the time t becomes $(T_0+j\Delta T)$ as shown in the step 111, the main control system 13 supplies a light emission trigger signal TP (a pulse of the high level "1") via the trigger controller 21 to the pulsed light source 1. Accordingly, the pulsed light source 1 emits pulsed light to expose a portion of the pattern of the reticle R on a portion of the wafer W.

Figure 5:
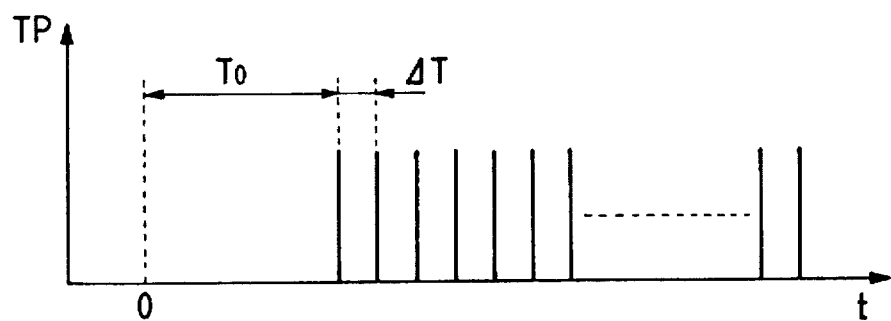
FIG. 5 is a timing chart showing light emission trigger pulses supplied to a pulsed light source.

FIG. 5 shows the light emission trigger signal TP in this embodiment. As shown in FIG. 5, from the moment when the time t reaches $T_o$, the light emission trigger signal TP is emitted in constant cycles $\Delta T$. Thereby, the pulsed light source 1 emits pulsed light in each cycle $\Delta T$ and the oscillation frequency f is expressed by $1/\Delta T$. The oscillation frequency f is the value stored in the memory 23 in advance. Then, in the step 112, 1 is added to the parameter j. When the parameter j has not reached the integer $N_T$ in the step 113, the pulsed light source 1 emits pulsed light at the constant frequency (in the constant cycles $\Delta T$) in the step 111 until the light emission of $N_T$ pulses is performed.

In FIG. 1, when the width of a shot area on the wafer W in the scan direction (X direction) is L1 and the width of the exposure area 24W in the scan direction is D, the minimum number $N_T$ of light pulses is as follows since the distance by which the wafer W is scanned per a cycle of the light emission of the pulsed light source 1 is v/f.

$$N_T = (L1+D)(v/f) \quad (3)$$
$$= (L1+D)f/v$$

Actually, at the start and end of scanning, a predetermined number of light pulses are added. Then, in the step 113, when the number of emitted light pulses has reached $N_T$, the main control system 13 finishes the scanning and exposure of the reticle R and the wafer W in the step 114. Consequently, the whole pattern of the reticle R is transferred to a shot area of the wafer W. In this case, the light emission of the pulsed light source 1 is performed at the constant frequency regardless of the X-coordinate of the reticle stage 11 and the X-coordinate of the XY stage 17 of the wafer W in this embodiment. However, the main control system 13 scans the reticle stage 11 and the XY stage 17 at respectively constant speeds. Therefore, in this embodiment, the fluctuations of the light emitting position (fluctuations of the light emission timing of the pulsed light source 1 to the position of the wafer W) are influenced by the value, which has multiplied the fluctuations $<\delta>$ of the light emission timing obtained in the step 104 by the scan speed v determined by the equation (2) in the step 105, and uneven speed of scanning.

Next, the method of calculating the minimum number $N_{min}$ of exposure pulses in the step 106 of FIG. 2 will be described. First, although the illumination field (illumination area 24) and the exposure area 24W on the wafer W are formed by the field stop 7 in FIG. 1, the shapes of the luminous intensity distributions along the cross sections of the illumination area 24 and the exposure area 24W in the scan direction are approximately trapezoids. The method for forming the trapezoid-shaped luminous intensity distribution will be described later.

Figure 4:
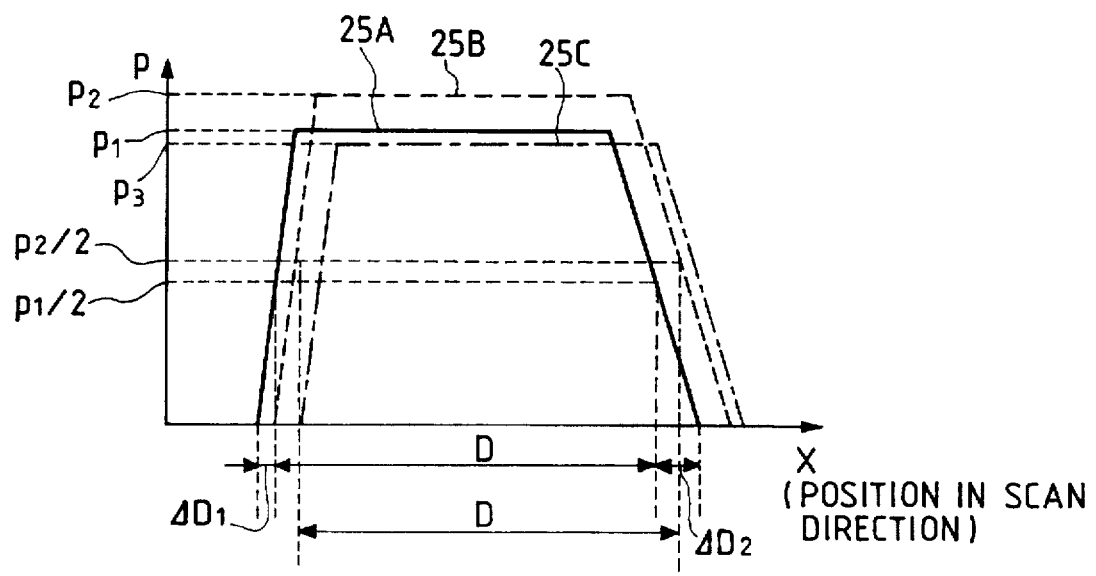
FIG. 4 is a graph showing the luminous intensity distribution of pulsed light on the surface of a wafer to be exposed.

FIG. 4 shows distribution curves 25A, 25B and 25C of the luminous intensity in the X direction for respective pulsed light in case that the luminous intensity distributions along the cross sections in the scan direction are approximately trapezoids. Actual width of the exposure area 24W in the scan direction is about a few mm and the width $\Delta D$ of the blurred portions is about 100 μm or more, so the luminous intensity distributions along the cross sections of FIG. 4 are approximately rectangular. The peak values of the distribution curves 25A, 25B and 25C are $P_1$, $P_2$ and $p_3$ respectively and the widths of the distribution curves 25A, 25B and 25C in the scan direction at positions where the values $p_1$, $p_2$ and $p_3$ become half are D commonly. Then, the value D can be deemed to be the width of the exposure area 24W in the scan direction.

Further, in FIG. 4, peak light amounts (i.e., the peak values $p_1$, $p_2$ and $p_3$) respectively for the first pulse (distribution curve 25A), the second pulse (distribution curve 25B) and the third pulse (distribution curve 25C) are varied due to the fluctuations of the pulsed light amounts and the intervals of the emission of the light pulses are not also constant due to the fluctuations of the light emitting positions. Here, in the slope portions on the lateral sides of the distribution curve 25A for the first pulse, when the number of pulses for overlapped exposures on and after the second pulse with respect to an area (with the widths $\Delta D_1$ and $\Delta D_2$) where the light amount values are half the peak value or less is $N_1$ or $N_2$, the following equations hold:

$$N_1 = int\left(\frac{\Delta D_1}{D} \cdot N\right), 2N_1 + 1 = int\left(\frac{2\Delta D_1}{D} \cdot N\right) \quad (4)$$
$$N_2 = int\left(\frac{\Delta D_2}{D} \cdot N\right), 2N_2 + 1 = int\left(\frac{2\Delta D_2}{D} \cdot N\right)$$

That is, since the number of pulses for exposures during the scanning of the exposure area with the width D is N (equation (1)), light pulses the number of which is proportional to each of the widths $\Delta D_1, \Delta D_2, 2\Delta D_1$ and $2\Delta D_2$ are emitted to the respective areas with the respective widths. However, in the respective pulse number integrated areas on the wafer, the adjacent points exposed by exposure light to the center of the slope portions on the lateral sides of the trapezoid-shaped luminous intensity distribution (i.e., the adjacent positions for determining the value D of the width) are adopted, so that the number of pulses on the areas of the widths $2\Delta D_1$ and $2\Delta D_2$ are respectively set to $(2N_1+1)$ and $(2N_2+1)$.

Next, the average of the half value D of the width of the slit-shaped illumination area, as disclosed in Japanese Patent Application No. 5-14483, is set to the average value $<D>$ by measuring each value of the width in advance at a plurality of points in the non-scan direction (Y direction) perpendicular to the scan direction. At this time, pulsed light emission distance $X_S$ corresponding to the distance which the wafer W moves in the scan direction during a cycle of the light emission of the pulsed light source 1 is obtained from the following equation.

$$X_s = \frac{<D>}{N} \quad (5)$$

Then, the variance $\Delta X$ between the real value D of the width of the exposure area which has the trapezoid-shaped luminous intensity distribution in a certain position of the non-scan direction and the average value $<D>$ of the width D is obtained from the following equation.

$$\Delta X = D - <D> = D - N \cdot X_s \quad (6)$$

The variance $\Delta x$ is generally governed by dimensional accuracy of the field stop 7, aberration of the illumination system and measurement accuracy of the average value $<D>$ of the width.

Here, exposure energy of the pulsed light on the wafer W when the pulsed light source 1 emits in number i cycle is set to $p_i$ and the offset (offset to the light emitting position) from the target position to the actual position on the wafer W in the scan direction (X direction) when emitting in the number i cycle is set to $\alpha_i$. When the average value and the fluctuations of the offset $\alpha_i$ are respectively set to $<\alpha>$ and $\Delta\alpha$, the luminous intensity distribution in the X direction emitting position, are determined by the following equation through which it is more difficult to calculate than those of equations (7) and (8). However, since the variance of the positions X is equivalent to the variance between the offset $\alpha$ to the light emitting position and the average value $<\alpha>$, $<\alpha>$ is set to 0 herein.

$$U(X) = 1 \pm \Bigg[ 1 - \frac{N_1 + N_2 + 1}{2N} + \left(\frac{X_s}{2\Delta D_1}\right)^2 \frac{N_1}{3N}(N_1+1)(2N_1+1) + \left(\frac{X_s}{2\Delta D_2}\right)^2 \frac{N_2}{3N}(N_2+1)(2N_2+1) \quad \frac{1}{\sqrt{N}} \frac{\Delta p}{<p>} +$$

$$\frac{1}{N} \left\{ \left(\frac{2N_1+1}{2\Delta D_1} - \frac{2N_2+1}{2\Delta D_2}\right)(X - <\alpha>) + \frac{2N_2+1}{2\Delta D_2} \Delta X \right\} \pm$$

$$\frac{1}{N} \Bigg[ \left\{ \left(\frac{2N_1+1}{2\Delta D_1} - \frac{2N_2+1}{2\Delta D_2}\right) X + \frac{2N_2+1}{2\neq D_2} \Delta X + \frac{2N_1+1}{(2\Delta D_1)^2}(X^2 + <\alpha>^2) + $$

$$\frac{2N_2+1}{(2\Delta D_2)^2} \{(\Delta X - X)^2 + <\alpha>^2\} \right\} \left(\frac{\Delta p}{<p>}\right)^2 + \left(\frac{2N_1+1}{(2\Delta D_1)^2} + \frac{2N_2+1}{(2\Delta D_2)^2}\right)(\Delta\alpha)^2 \Bigg]^{1/2}$$

$$= 1 \pm \Bigg[ 1 - \frac{N_1+N_2+1}{2N} + \left(\frac{X_s}{2\Delta D_1}\right)^2 \frac{N_1}{3N}(N_1+1)(2N_1+1) + \left(\frac{X_s}{2\Delta D_2}\right)^2 \frac{N_2}{3N}(N_2+1)(2N_2+1) \frac{1}{\sqrt{N}} \frac{\Delta p}{<p>} +$$

$$\frac{1}{N} \left\{ \left(\frac{2N_1+1}{2\Delta D_1} - \frac{2N_2+1}{2\Delta D_2}\right) X + \frac{2N_2+1}{2\Delta D_2} \Delta X \right\} \pm$$

$$\frac{1}{N} \Bigg[ \left\{ \left(\frac{2N_1+1}{2\Delta D_1} - \frac{2N_2+1}{2\Delta D_2}\right) X + \frac{2N_2+1}{2\Delta D_2} \Delta X + \frac{2N_1+1}{(2\Delta D_1)^2} X^2 +$$

$$\frac{2N_2+1}{(2\Delta D_2)^2}(\Delta X - X)^2 \right\} \left(\frac{\Delta p}{<p>}\right)^2 + \left(\frac{2N_1+1}{(2\Delta D_1)^2} + \frac{2N_2+1}{(2\Delta D_2)^2}\right)(\Delta\alpha)^2 \Bigg]^{1/2}$$

$I(X)$ (mJ/cm$^2$) after scanning the wafer W to the slit-shaped exposure area 24W, in which the center point of the slope portion of the width $2\Delta D_1$ is set to X=0, is obtained from the following equation.

$$I(X) = \sum_{i=-(N+N_2)}^{-(N-N_2)} p_i \cdot \left(1 - \frac{X-(D-\Delta D_2)-iX_s-\alpha_i}{2\Delta D_2}\right) +$$

$$\sum_{i=-(N-N_2)+1}^{-N_1-1} p_i + \sum_{i=-N_1}^{N_1} p_i \cdot \left(\frac{X+\Delta D_1-iX_s-\alpha_i}{2\Delta D_1}\right),$$

wherein, $(|X| \leq \Delta D_1, \Delta D_2)$     (7)

Or, in the slope portions of the trapezoid-shaped luminous intensity distribution, the luminous intensity distribution $I(X)$ with respect to the points which are not exposed at all on the wafer W is as follows:

$$I(X) = \sum_{i=-N}^{-1} p_i,$$

wherein, $(X_s > 2\Delta D_1 \text{ and } 2\Delta D_2, \text{ and } \Delta D_1 \text{ and } \Delta D_2 < |X| < X_s)$   (8)

At this time, accuracy U(X) of the exposure amount and the uniformity of the luminous intensity on the exposure surface in the scan direction, in view of the pulsed light energy pi and the fluctuations of offset $\alpha_i$ to the light wherein, $(|X| \leq \Delta D_1, \Delta D_2)$     (9)

Or, in the slope portions of the trapezoid-shaped luminous intensity distribution, the accuracy U(X) with respect to the points which are not exposed at all on the wafer W is as follows:

$$U(X) = 1 \pm \frac{1}{\sqrt{N}} \left(\frac{\Delta p}{<p>}\right)$$

wherein, $(X_s > 2\Delta D_1 \text{ and } 2\Delta D_2, \text{ and } \Delta D_1 \text{ and } \Delta D_2 < |X| < X_s)$   (10)

Further, since the slope portions on the lateral sides of the luminous intensity distribution are symmetric with respect to each other, the relationship thereof approximates with the following equation.

$N_1 \cong N_2 \cong N_{12}$, $\Delta D_1 \cong \Delta D_2 \cong \Delta D_{12}$     (11)

From the approximation mentioned above, the equation (9) can be simplified as follows:

$$U(X) = 1 \pm \sqrt{1 - \frac{2N_{12}+1}{6N} \left(2 - \frac{1}{N_{12}}\right) \frac{1}{\sqrt{N}} \left(\frac{\Delta p}{<p>}\right)} + \qquad (12)$$

$$\frac{1}{N} \left\{ \frac{1}{2} \left( \frac{2N_1+1}{\Delta D_1} - \frac{2N_2+1}{\Delta D_2} \right) X + \frac{2N_{12}+1}{2\Delta D_{12}} \Delta X \right\} \pm$$

$$\frac{1}{N} \left[ \left\{ \frac{1}{2} \left( \frac{2N_1+1}{\Delta D_1} - \frac{2N_2+1}{\Delta D_2} \right) X + \frac{2N_{12}+1}{2\Delta D_{12}} \Delta X + \frac{2N_{12}+1}{(2\Delta D_{12})^2} \{X^2 + (\Delta X - X)^2\} \right\} \cdot \right.$$

$$\left. \left( \frac{\Delta p}{<p>} \right)^2 + \frac{2N_{12}+1}{(2\Delta D_{12})^2} 2(\Delta \alpha)^2 \right]^{1/2}, \times N_{12} \geq 1 \right)$$

or $$U(X) = 1 \pm \sqrt{1 - \frac{1}{2N} \frac{1}{\sqrt{N}} \left(\frac{\Delta p}{<p>}\right)} +$$

$$\frac{1}{N} \left\{ \frac{1}{2} \left( \frac{2N_1+1}{\Delta D_1} - \frac{2N_2+1}{\Delta D_2} \right) X + \frac{2N_{12}+1}{2\Delta D_{12}} \Delta X \right\} \pm$$

$$\frac{1}{N} \left[ \left\{ \frac{1}{2} \left( \frac{2N_1+1}{\Delta D_1} - \frac{2N_2+1}{\Delta D_2} \right) X + \frac{2N_{12}+1}{2\Delta D_{12}} \Delta X + 2N_{12}+1 (2\Delta D_{12})^2 \{X^2 + (\Delta X - X)^2\} \right\} \cdot \right.$$

$$\left. \left( \frac{\Delta p}{<p>} \right)^2 + \frac{2N_{12}+1}{(2\Delta D_{12})^2} 2(\Delta \alpha)^2 \right]^{1/2}, (N_{12} = 0)$$

In the right side of the equation (12), the second member shows exposure amount control reproduction accuracy $A_{rep}$ on the respective pulse number integrated area of the wafer W. The exposure amount control reproduction accuracy Arep must meet the following condition.

$$A_{rep} = \sqrt{1 - \frac{2N_{12}+1}{6N} \left(2 - \frac{1}{N_{12}}\right)} \frac{1}{\sqrt{N}} \left(\frac{\Delta p}{<p>}\right) < \qquad (13)$$

$$\frac{1}{\sqrt{N}} \left(\frac{\Delta p}{<p>}\right),$$

or $$A_{rep} = \sqrt{1 - \frac{1}{2N}} \frac{1}{\sqrt{N}} \left(\frac{\Delta p}{<p>}\right) < \frac{1}{\sqrt{N}} \left(\frac{\Delta p}{<p>}\right)$$

Both the right sides of the inequalities of the equation (13) are equal to the exposure amount control reproduction accuracy determined from the equation (10). Also, the number N of the exposure pulses is obtained from the equation (13) as follows:

$$N > \left( \frac{1}{(A_{rep})_{max}} \frac{\Delta p}{<p>} \right)^2 \qquad (14)$$

Then, when the exposure amount control reproduction accuracy is 1% (at three times the standard deviation 3σ) and the fluctuation of pulsed light energies ($\Delta p/<p>$) is 5% (at 3σ), the relationship of the number N of pulses is N equal to or more than 25 (pulses) from the equation (14). Accordingly, the minimum number Nmin of exposure pulses on each pulse number integrated area is set to 25. However, when the coherency of the pulsed light source 1 is high, as disclosed in the U.S.Pat. No. 4,970,546, the minimum number $N_{min}$ of exposure pulses is actually determined adding some number of pulses necessary for reducing interference pattern and contrast by speckle pattern.

Next, in the third member of the right sides of the equation (12), a member, (1/N) (1/2){($2N_1+1$) /$\Delta D_1$−($2N_2+1$) /$\Delta D_2$} X, expresses deterioration of the uniformity of luminous intensity caused by the dissymmetry of the slopes on the lateral sides of the trapezoid-shaped luminous intensity distribution. Also, next member, (1/N) {($2N_{12}+1$) / ($2\Delta D_{12}$)} ΔX, expresses the exposure amount bias caused by the variance Δx of the value of the width shown in equation (6) (when the variance ΔX in the non-scan direction is constant) or the deterioration of the uniformity of luminous intensity in the non-scan direction.

Further, in the right side of the equation (12), the fourth member is produced by the reproduction accuracy of the third member in which the fluctuations of the pulsed light energies ($\Delta p/<p>$) and the fluctuations of the offset Δα to the exposure positions contribute to the reproduction accuracy of the deterioration of the uniformity of luminous intensity in the scan direction. Here, when the deterioration of the uniformity of luminous intensity in the scan direction is represented by $U_{Scan}$ and the reproduction accuracy of ($U_{scan}+U_{Bias}$) is represented $A_{Scan}$, the following relationships are carried by:

$$U_{Scan} = \frac{1}{2N} \left| \frac{2N_1+1}{\Delta D_1} - \frac{2N_2+1}{\Delta D_2} \right| = |X| \qquad (15)$$

$$U_{Bias} = \frac{1}{2N} \frac{2N_{12}+1}{\Delta D_{12}} \cdot |\Delta X| \qquad (16)$$

$$A_{Scan} = \frac{1}{N} \left[ \left\{ \frac{1}{2} \left( \frac{2N_1+1}{\Delta D_1} - \frac{2N_2+1}{\Delta D_2} \right) X + \right. \right. \qquad (17)$$

-continued $$\left. \frac{2N_{12}+1}{2\Delta D_{12}} \Delta X + \frac{2N_{12}+1}{(2\Delta D_{12})^2} \{X^2 + (\Delta X - X)^2\} \right\} \left( \frac{\Delta p}{<p>} \right)^2 +$$

$$\left. \frac{2N_{12}+1}{(2\Delta D_{12})^2} 2(\Delta \alpha)^2 \right]^{1/2}$$

Figure 6:
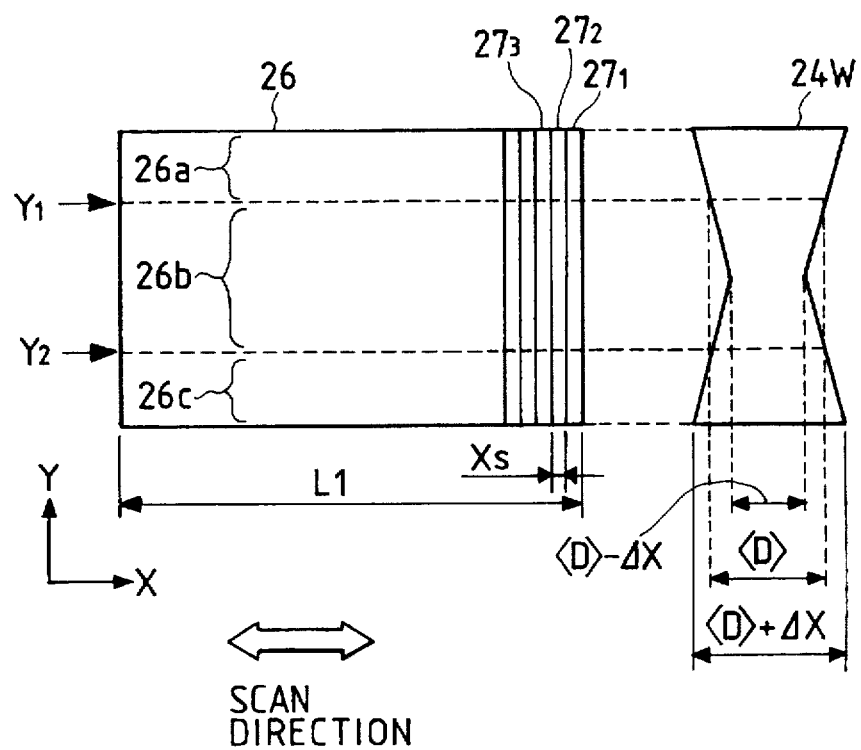
FIG. 6 is an enlarged plan view showing a shot area on the wafer and a slit-shaped exposure area.

Here, the deterioration $U_{Scan}$ of the uniformity of luminous intensity in the scan direction and the exposure amount bias or the deterioration $U_{Bias}$ of the uniformity of luminous intensity in the non-scan direction shown in the equations (15) and (16) contribute to the uniformity of luminous intensity and the exposure amount bias as shown in FIG. 6.

FIG. 6 shows a state of a certain shot area 26 on the wafer W of FIG. 1, in which the slit-shaped exposure area 24W is formed on the right side of the X direction of the shot area 26. Due to the convenience of the explanation, the shape of the exposure area 24W in the scan direction becomes narrow in the center portion of the non-scan direction (Y direction). That is, when the average value of the width in the scan direction of the exposure area 24W is represented by <D>, the width in the scan direction of both end portions of the Y direction becomes (<D>+$\Delta$X) and the width in the scan direction of the center portion of the Y direction becomes (<D>-$\Delta$X).

The shot area 26 of the width L1 is scanned to the exposure area 24W in the X direction so that the patterns of the reticle R are successively exposed on the shot area 26. Also, when the distance of the wafer moving in the X direction during a cycle of the light emission of the pulsed light source is represented by $X_s$, areas $27_1$, $27_2$, $27_3$ ... dividing the shot area 26 by the width $X_s$ in the X direction become the pulse number integrated areas respectively. In this case, the deterioration UScan of the uniformity of luminous intensity in the scan direction shown in the equation (15) expresses unevenness of luminous intensity occurring periodically in the scan direction for respective pulse number integrated areas $27_1$, $27_2$, $27_3$ ... Also, the exposure amount bias or the deterioration $U_{Bias}$ of the uniformity of luminous intensity in the non-scan direction shown in the equation (16) is deemed to be the unevenness of luminous intensity on the shot area 26 of the wafer in the non-scan direction when the integrated value of luminous intensity on the exposure area 24W (within the illumination field) in the scan direction is proportional to the value of the width on the exposure area 24W in the scan direction.

Concretely, in FIG. 6, sections 26a and 26c on the shot area 26, in which respective widths are set between (<D>+$\Delta$X) and <D> of the exposure area 24W in the scan direction to pass through larger areas than that of the average value <D>, become overexposed. On the other hand, section 26b on the shot area 26 in which the width is set between (<D>−$\Delta$X) and <D> of the exposure area 24W in the scan direction to pass through a narrower area than that of the average value <D>, becomes underexposed. Also, is sections passing through the exposure area 24W on straight lines in which the widths in the scan direction correspond to the average value <D>, i.e., on the straight lines where the Y-coordinates on the shot area 26 represent $Y_1$ and $Y_2$, the integrated exposure amount becomes a proper exposure amount.

In addition, the luminous intensity distribution of the exposure area 24W in the scan direction of FIG. 6 actually has a trapezoid shape as shown in FIG. 4. Thus, as an example of forming the trapezoid-shaped luminous intensity distribution, there is provided a method such that the field stop 7 is defocussed from the surface conjugate to the surface forming the pattern of the reticle R and the exposure surface of the wafer W in FIG. 1 as described in detail later. With such a method, when the luminous intensity distribution of the exposure area 24W in the scan direction is formed to be a trapezoid shape by defocussing the field stop 7, the slope portions on the lateral sides of the trapezoid-shaped luminous intensity distribution are blurred portions of projected images from edge portions of the field stop 7. Hereinafter, the slope portions of the luminous intensity distribution are referred to as the blurred portions of the edge portions on the exposure area 24W, while the width of the slope portions in the scan direction is referred to as the blurred width.

Then, from the equation (16), the allowable value of the blurred width of the edge portions on the exposure area 24W in the scan direction is obtained. This is determined as follows in view of the equations (4) and (11). Here, the allowable value of the exposure amount bias or the deterioration $U_{Bias}$ of the uniformity of luminous intensity in the non-scan direction is represented by $[U_{Bias}]_{max}$.

$$U_{Bias} = \frac{|\Delta X|}{D} \leq [U_{Bias}]_{max} \ (N_{12} \geq 1) \tag{18}$$

Or, the equation (16) is given as follows:

$$U_{Bias} \leq \frac{|\Delta X|}{2N_{min}\Delta D_{12}} \leq [U_{Bias}]_{max} \ (N_{12} = 0) \tag{19}$$

As shown below, equation (20) as a conditional inequality of the variance $\Delta X$ is obtained from the equation (18), while equation (21) as a conditional inequality of the average value $D_{12}$ of the blurred widths, at the half peak value points, on the lateral sides of the exposure area 24W is obtained from the equation (19).

$$|\Delta X| \leq D \cdot [U_{Bias}]_{max} \tag{20}$$

$$\Delta D_{12} \geq \frac{|\Delta X|}{2N_{min}[U_{Bias}]_{max}} \tag{21}$$

The following relationship is necessary for holding the equation (21) as usual.

$$\Delta D_{12} \geq \frac{|\Delta X|_{max}}{2N_{min}[U_{Bias}]_{max}} = \frac{D}{2N_{min}} \tag{22}$$

Here, when the value D of the width, at the half peak value points, on the slit-shaped exposure area 24W in the scan direction is 5 mm and the exposure amount bias or the allowable value $[U_{Bias}]_{max}$ of the deterioration $U_{Bias}$, of the uniformity of luminous intensity in the non-scan direction is 0.5%, $\Delta X$ is equal to or less than 25 μm from the equation (20). Also, when the minimum number $N_{min}$ of exposure pulses is equal to or more than 25, the average value $\Delta D_{12}$ is a value which is equal to or more than 100 (μm) from the equation (22).

Further, from the equation (9), X is equal to or less than $\Delta D_1$ and $\Delta D_2$ so that the equation (15) is given as follows:

$$U_{Scan} < \frac{1}{2N} \left| \frac{2N_1+1}{\Delta D_1} - \frac{2N_2+1}{\Delta D_2} \right| \Delta D_{12} \tag{23}$$

The right side of the equation is maximum when N is equal to $N_{min}$, and $N_1$ and $N_2$ are respectively equal to 0. Then, if N is equal to $N_{min}$, and $N_1$ and $N_2$ are respectively equal to 0, the following relationship is obtained from the equation (23).

$$U_{Scan} < \frac{\Delta D_{12}}{2N_{min}} \left| \frac{1}{\Delta D_1} - \frac{1}{\Delta D_2} \right| \quad (24)$$

The symmetry of the value $\Delta D_1$ and $\Delta D_2$, at the half peak value points, of the blurred width of the edge portions on the lateral sides of the exposure area 24W in the scan direction (see FIG. 4) is obtained from the equation (24). Here, when the allowable value of the deterioration $U_{scan}$ of the uniformity of luminous intensity in the scan direction is represented by $[U_{scan}]_{max}$, the equation (24) is given as follows:

$$\left| \frac{1}{\Delta D_1} - \frac{1}{\Delta D_2} \right| \leq \frac{2N_{min}}{\Delta D_{12}} [U_{Scan}]_{max} \quad (25)$$

This is a condition of the symmetry with respect to blurred portions of the edge portions on the lateral sides of the exposure area 24W in the scan direction. For example, when the allowable value $[U_{scan}]_{max}$ of the $U_{scan}$ is 0.2%, the minimum number $N_{min}$ of exposure pulses is 25 and the average value $\Delta D_{12}$ of the width is 100 μm, the equation (25) is given as follows:

$$\left| \frac{1}{\Delta D_1} - \frac{1}{\Delta D_2} \right| \leq 1.0 \times 10^{-3} \, (1/\mu m) \quad (26)$$

Finally, the following equation is obtained by substituting the equations (4), (15) and (16) into the equation (17).

$$A_{Scan} = \left[ \left\{ U_{Scan} + U_{Bias} + \frac{1}{\Delta D_{12}} \frac{2N_{12}+1}{2N\Delta D_{12}} X^2 - \frac{X}{\Delta D_{12}} U_{Bias} + \frac{N}{2N_{12}+1} (U_{Bias})^2 \right\} \cdot \right. \quad (27)$$

$$\frac{1}{N} \left( \frac{\Delta p}{<p>} \right)^2 + \frac{2}{2N_{12}+1} \left( \frac{2N_{12}+1}{2N\Delta D_1} \right)^2 (\Delta \alpha)^2 \right]^{1/2} \leq$$

$$\left[ \left\{ [U_{Scan}]_{max} + \left( 1 - \frac{X}{\Delta D_{12}} \right) [U_{Bias}]_{max} + \frac{1}{D\Delta D_{12}} X^2 + \frac{N_{min}}{2N_{12}+1} [U_{Bias}]_{max}^2 \right\} \cdot \right.$$

$$\left. \frac{1}{N_{min}} \left( \frac{\Delta p}{<p>} \right)^2 + \frac{2}{2N_{12}+1} \cdot \frac{1}{D^2} \cdot (\Delta \alpha)^2 \right]^{1/2}$$

When X is equal to $-\Delta D_{12}$ and $N_{12}$ is equal to 0, the right side of the equation is maximum so that the equation (27) holds:

$$A_{Scan} \leq \left[ \left\{ [U_{Scan}]_{max} + 2[U_{Bias}]_{max} + \frac{\Delta D_{12}}{D} + N_{min} [U_{Bias}]_{max}^2 \right\} \cdot \right. \quad (28)$$

$$\left. \frac{1}{N_{min}} \left( \frac{\Delta p}{<p>} \right)^2 + \frac{2}{D^2} (\Delta \alpha)^2 \right]^{1/2} \leq$$

$$\left[ \left\{ [U_{Scan}]_{max} + 2[U_{Bias}]_{max} + \frac{1}{2N_{min}} + N_{min} [U_{Bias}]_{max}^2 \right\} \cdot \right.$$

$$\left. \frac{1}{N_{min}} \left( \frac{\Delta p}{<p>} \right)^2 + \frac{2}{D^2} (\Delta \alpha)^2 \right]^{1/2}$$

If the allowable value of the $A_{Scan}$ is represented by $[A_{Scan}]_{max}$, the equation (28) can be modified as follows:

$$\Delta \alpha \leq \left[ \frac{D^2}{2} \left\{ [A_{Scan}]_{max}^2 - \left\{ [U_{Scan}]_{max} + 2[U_{Bias}]_{max} + \frac{1}{2N_{min}} + \right. \right. \right. \quad (29)$$

$$\left. \left. \left. N_{min} [U_{Bias}]_{max}^2 \right\} \cdot \frac{1}{N_{min}} \left( \frac{\Delta p}{<p>} \right)^2 \right\} \right]^{1/2}$$

Here, when the minimum number Nmin of exposure pulses is 25, the value D of the width is 5 mm, the fluctuation of the pulsed light energies $(\Delta p/<p>)$ is 5%, $[U_{Bias}]_{max}$ is 0.5% and $[A_{Scan}]_{max}$ is 0.5%, the equation (29) is given as follows:

$$\Delta \alpha \leq 16.4 \, (\mu m)$$

As a result, a standard (allowable value) of the fluctuations of offset $\Delta \alpha$ to the exposure positions (unevenness of the exposure positions) can be obtained.

If the $[A_{rep}]_{max}$, the $[U_{Bias}]_{max}$, the $[U_{Scan}]_{max}$, the $[A_{Scan}]_{max}$, the D and $(\Delta p/<p>)$ are given in the equations (14), (20), (21), (25) and (29) as shown above, the minimum number $N_{min}$ of exposure pulses, variance $|\Delta X|$ of the width, at the half peak value points, of the trapezoid-shaped luminous intensity distribution of the exposure area 24W in the scan direction, the average value $\Delta D_{12}$ of the blurred width at the half peak value points, of the slope portions on the lateral sides of the luminous intensity distribution, the symmetry $|(1/\Delta D_1)-(1/\Delta D_2)|$ and the allowable value of the fluctuations of offset $\Delta$ to the exposure positions are obtained.

Next, methods of forming the slope portions on the lateral sides of luminous intensity distribution of the exposure area 24W in the scan direction will be described. The first method is a method for having a trapezoid-shaped transmittance distribution as shown in FIG. 4 by use with a mask (optical filter) such that an opaque material like chrome etc. is adhered changing its thickness onto a substrate (quartz or the like) transparent with respect to light of the same wavelength as the exposure light. This mask is placed in contact with the field stop 7 as an illumination field stop.

Also, the second method is a method in which an illumination field stop having rectangle-shaped transmittance distribution along the cross sections is defocussed from the position conjugate to the surface forming the pattern of the reticle R and the exposure surface and placed in the field stop 7. At this time, when light emitted from a point of the field stop 7 is blurred in a circle with radius $\Delta r$ on the exposure surface of the wafer W and the shape of the edge portions of luminous intensity distribution along the cross sections of the slit-shaped exposure area 24W in the scan direction (X direction) expresses the luminous intensity distribution $X/\Delta r$ with the function $I(X/\Delta r)$, the following equation holds:

$$I(X/\Delta r) = \frac{1}{\pi} \left\{ \arccos(X/\Delta r) - (X/\Delta r) \sqrt{1-(X/\Delta r)^2} \right\} \quad (30)$$

Here, in the equation (30), the exposure energy p is normalized with 1. When Taylor development around the origin 0 with respect to the $X/\Delta r$ is performed in this equation (30), the following equation holds:

$$I(X/\Delta r) = \frac{1}{2} - \frac{2}{\pi} \cdot \frac{X}{\Delta r} \quad (31)$$

By comparing the equation (31) with the equation (7), it will be understood that the $(\pi/2)\Delta r_{12}$ and the $2\Delta D_{12}$ correspond to each other. Accordingly, the radius $\Delta r$ of the blurred dotted image can be determined by giving the following condition to the condition of the average value $\Delta D_{12}$ of the blurred width, at the half value points, of luminous intensity obtained from the equation (21).

$$\Delta r_{12} = \frac{4}{\pi} \Delta D_{12} \quad (32)$$

As described above, according to the embodiment of the present invention, the exposure amount control is performed in consideration of not only the fluctuations of pulsed light energies from the pulsed light source 1 but also the fluctuations of the light emission timing, so that it is advantageous that the control accuracy of the exposure amount and the uniformity of luminous intensity can be improved. Also, since the light emission triggers of the pulsed light source 1 are supplied to the pulsed light source 1 in a constant cycle and the mask R and the wafer W are respectively scanned at constant speed, the effect of the fluctuations of read timing of the result (measurement) from the measurement device such as a laser interferometer or the like is reduced, so that the control accuracy of the exposure amount and the uniformity of luminous intensity can be further improved.

In addition, although the above-described embodiment has adopted the present invention to the projection exposure apparatus placing the projection optical system therein, the present invention can be adopted to, for example, a reflective type projection exposure apparatus, a proximity type exposure apparatus or a contact type exposure apparatus. Thus, it will be understood that the present invention is not limited to the embodiment described above and the various structural changes and modifications can be made within the scope of the present invention.

As described above, according to the present invention, in a scan type exposure apparatus in which a pulsed light source is used as an exposure light source, a condition of the average value of the width of the slope portions on the lateral sides of luminous intensity distribution on a predetermined (slit-shaped) illumination area of a substrate in the scan direction is defined in accordance with a conditional equation obtaining accuracy of a desired exposure amount and the uniformity of luminous intensity, so that a certain necessary condition for preferably maintaining the exposure amount and the uniformity of luminous intensity in the non-scan direction can be met.

Also, when a condition of the symmetry with respect to the widths of the slope portions on the lateral sides of luminous intensity distribution in the scan direction is defined, the exposure amount and the uniformity of luminous intensity in the scan direction can be preferably obtained.

Furthermore, when the luminous intensity distribution on the predetermined illumination area of the substrate in the scan direction has a trapezoid shape by disposing a field stop for illuminating the predetermined illumination area to be defocussed in a predetermined amount from a position optically conjugate to the exposure surface of the substrate, the luminous intensity distribution can be shaped to be a trapezoid with a simple structure, so that it is advantageous that the widths of the slope portions on the lateral sides of the trapezoid-shaped luminous intensity distribution can be easily set to a desired value.

What is claimed is:

1. An exposure amount control device for controlling an integrated exposure amount of pulsed light to a photosensitive substrate within a predetermined range in which a pattern of a mask is successively exposed on the substrate by synchronously scanning the mask forming the pattern to be exposed and the photosensitive substrate relatively with respect to a predetermined illumination area illuminated with pulsed light from a pulsed light source, said device satisfying the following relationship:

$$\Delta D_{12} \geq D/(2N_{min})$$

wherein luminous intensity distribution of the predetermined illumination area in a scan direction is trapezoid-shaped, $\Delta D_{12}$ is an average value of the widths, at half peak value points, of the slope portions on the lateral sides of the trapezoid-shaped luminous intensity distribution in the scan direction, D is the width, at said half peak value points, of the luminous intensity distribution on the predetermined illumination area of the substrate in the scan direction and Nmin is a minimum number of exposure pulses necessary for controlling an integrated exposure amount at respective points on the substrate within predetermined accuracy.

2. A device according to claim 1, said device further satisfying the following relationship:

$$|(1/\Delta D)-(1/\Delta D_2)| \leq 2N_{min} \cdot 3 \, [U_{Scan}]_{max}/\Delta D_{12}]$$

$$|(1/\Delta D_1)-(1/\Delta D_2)| \leq 2N_{min}[U_{Scan}]_{max}/\Delta D_{12}$$

wherein $\Delta D_1$ and $\Delta D_2$ are the widths, at half peak value points, of the slope portions on the lateral sides of the luminous intensity distribution of the predetermined illumination area on the substrate in the scan direction and $[U_{Scan}]_{max}$ is an allowable value of the unevenness of luminous intensity on the substrate in the scan direction.

3. A device according to claim 1, wherein the luminous intensity distribution on the predetermined illumination area of the substrate is shaped to be a trapezoid by defocussing a field stop for illuminating the predetermined illumination area in a predetermined amount from a position optically conjugate to an exposure surface of the substrate.

4. An exposure amount control device for controlling an integrated exposure amount of pulsed light to a photosensitive substrate within a predetermined range in which a pattern of a mask is successively exposed on the substrate by synchronously scanning the mask forming the pattern to be exposed and the photosensitive substrate with respect to a predetermined illumination area illuminated with pulsed light from a pulsed light source, said device satisfying the following relationship:

$$D_{12} \geq \frac{|\Delta X|}{2N_{min}[U_{bias}]_{max}}$$

wherein luminous intensity distribution of the predetermined illumination area in a scan direction is trapezoid-shaped, $\Delta D_{12}$ is an average value of the widths, at half peak value points, of the slope portions on the lateral sides of the trapezoid-shaped luminous intensity distribution in the scan direction, $|\Delta X|$ is a difference between an average value of width, at said half peak value points, of the luminous intensity distribution in the scan direction and the actual value of that width at a predetermined position, $[U_{Bias}]_{max}$ is an allowable value of deterioration of the uniformity of luminous intensity, and $N_{min}$ is a minimum number of exposure pulses necessary for controlling an integrated exposure amount at respective points on the substrate within predetermined accuracy.

5. A device according to claim 4, wherein the luminous intensity distribution on the predetermined illumination area of the substrate is shaped to be a trapezoid by defocussing a field stop for illuminating the predetermined illumination area in a predetermined amount from a position optically conjugate to an exposure surface of the substrate.

6. An exposure apparatus for exposing a pattern of a mask to a photosensitive substrate by synchronously scanning the mask forming the pattern to be exposed and the photosensitive substrate relatively with respect to a predetermined illumination area illuminated with pulsed light from a pulsed light source, said apparatus satisfying the following relationship:

$$\Delta D_{12} \geq D/(2N_{min})$$

wherein luminous intensity distribution of the predetermined illumination area in a scan direction is trapezoid-shaped, $\Delta D_{12}$ is an average value of the widths, at half peak value points, of the slope portions on the lateral sides of the trapezoid-shaped luminous intensity distribution in the scan direction, D is the width, at said half peak value points, of the luminous intensity distribution on the predetermined illumination area of the substrate in the scan direction and $N_{min}$ is a minimum number of exposure pulses necessary for controlling an integrated exposure amount at respective points on the substrate within predetermined accuracy.

7. An apparatus according to claim 6, wherein the luminous intensity distribution on the predetermined illumination area of the substrate is shaped to be a trapezoid by defocussing a field stop for illuminating the predetermined illumination area in a predetermined amount from a position optically conjugate to an exposure surface of the substrate.

8. An exposure apparatus for exposing a pattern of a mask to a photosensitive substrate by synchronously scanning the mask forming the pattern to be exposed and the photosensitive substrate with respect to a predetermined illumination area illuminated with pulsed light from a pulsed light source, said apparatus satisfying the following relationship:

$$D_{12} \geq \frac{|\Delta X|}{2N_{min}[U_{bias}]_{max}}$$

wherein luminous intensity distribution of the predetermined illumination area in a scan direction is trapezoid-shaped, $\Delta D_{12}$ is an average value of the widths, at half peak value points, of the slope portions on the lateral sides of the trapezoid-shaped luminous intensity distribution in the scan direction, $|\Delta X|$ is a difference between an average value of width, at said half peak value points, of the luminous intensity distribution in the scan direction and the actual value of that width at a predetermined position, $[U_{bias}]_{max}$ is an allowable value of deterioration of the uniformity of luminous intensity, and $N_{min}$ is a minimum number of exposure pulses necessary for controlling an integrated exposure amount at respective points on the substrate within predetermined accuracy.

9. An apparatus according to claim 8, wherein the luminous intensity distribution of the predetermined illumination area is shaped to be a trapezoid by defocussing a field stop for illuminating the predetermined illumination area in a predetermined amount from a position optically conjugate to an exposure surface of the substrate.

10. An exposure amount control method for controlling an integrated exposure amount of pulsed light to a photosensitive substrate within a predetermined range, in which a pattern of a mask is successively exposed on the substrate by synchronously scanning the mask forming the pattern to be exposed and the photosensitive substrate with respect to a predetermined illumination area illuminated with pulsed light from a pulsed light source, wherein:

luminous intensity distribution of the predetermined illumination area on said substrate in a scan direction is shaped to be a trapezoid, and the widths of slope portions of the trapezoid-shaped luminous intensity distribution in the scan direction is determined based on a minimum number of exposure pulses necessary for controlling an integrated exposure amount at respective points on the substrate within predetermined accuracy and the width, at the half peak value points, of said trapezoid-shaped luminous intensity distribution in the scan direction.

11. A method according to claim 10, wherein the average value of said widths, at the half peak value points, of said slope portions in the scan direction is at least as large as a value obtained by dividing said width of said trapezoid-shaped luminous intensity distribution by twice said minimum number of exposure pulses.

12. A method according to claim 11, wherein said trapezoid-shaped luminous intensity distribution is determined so that a symmetry of two slope portions on lateral sides of said trapezoid-shaped luminous intensity distribution is less than or equal to an allowable value which is determined based on a minimum number of exposure pulses.

13. A method according to claim 10, wherein the luminous intensity distribution of the predetermined illumination area on the substrate is shaped to be a trapezoid by defocussing a field stop for illuminating the predetermined illumination area in a predetermined amount from a position optically conjugate to an exposure surface of the substrate.

14. A method according to claim 10, wherein said trapezoid-shaped luminous intensity distribution is determined so that a symmetry of two slope portions on lateral sides of said trapezoid-shaped luminous intensity distribution is less than or equal to an allowable value which is determined based on a minimum number of exposure pulses.

15. A projection exposure method for controlling an-integrated exposure amount of pulsed light to a photosensitive substrate within a predetermined range, in which a pattern of a mask is successively exposed on the substrate by synchronously scanning the mask forming the pattern to be exposed and the photosensitive substrate with respect to a predetermined illumination area illuminated with pulsed light from a pulsed light source, wherein:

luminous intensity distribution of the predetermined illumination area on said substrate in a scan direction is shaped to be a trapezoid, and the widths of slope portions of the trapezoid-shaped luminous intensity distribution in the scan direction is determined based on a minimum number of exposure pulses necessary for controlling an integrated exposure amount at respective points on the substrate within predetermined accuracy and the width, at the half peak value points, of said trapezoid-shaped luminous intensity distribution in the scan direction.

16. A method according to claim 15, wherein the luminous intensity distribution of the predetermined illumination area on the substrate is shaped to be a trapezoid by defocussing a field stop for illuminating the predetermined illumination area in a predetermined amount from a position optically conjugate to an exposure surface of the substrate.

17. A method according to claim 15, wherein said trapezoid-shaped luminous intensity distribution is determined so that a symmetry of two slope portions on lateral sides of said trapezoid-shaped luminous intensity distribution is less than or equal to an allowable value which is determined based on a minimum number of exposure pulses.

18. A semiconductor device manufacturing method for controlling an integrated exposure amount of pulsed light to a photosensitive substrate within a predetermined range, in which a pattern of a mask is successively exposed on the substrate by synchronously scanning the mask forming the pattern to be exposed and the photosensitive substrate with respect to a predetermined illumination area illuminated with pulsed light from a pulsed light source, wherein;
    luminous intensity distribution of the predetermined illumination area on said substrate in a scan direction is shaped to be a trapezoid, and the widths of slope portions of the trapezoid-shaped luminous intensity distribution in the scan direction is determined based on a minimum number of exposure pulses necessary for controlling an integrated exposure amount at respective points on the substrate within predetermined accuracy and the width, at the half peak value points, of said trapezoid-shaped luminous intensity distribution in the scan direction.

19. A method according to claim 18, wherein the luminous intensity distribution of the predetermined illumination area on the substrate is shaped to be a trapezoid by defocussing a field stop for illuminating the predetermined illumination area in a predetermined amount from a position optically conjugate to an exposure surface of the substrate.

20. A method according to claim 18, wherein said trapezoid-shaped luminous intensity distribution is determined so that a symmetry of two slope portions on lateral sides of said trapezoid-shaped luminous intensity distribution is less than or equal to an allowable value which is determined based on a minimum number of exposure pulses.

21. An exposure amount control method for controlling an integrated exposure amount of pulsed light to a photosensitive substrate within a predetermined range, in which a pattern of a mask is successively exposed on the substrate by synchronously scanning the mask forming the pattern to be exposed and the photosensitive substrate with respect to a predetermined illumination area illuminated a with pulsed light from a pulsed light source, wherein:
    luminous intensity distribution of the predetermined illumination area on said substrate in a scan direction is shaped to be a trapezoid, and all points of an area to be exposed on said substrate are exposed at least one time by slope portions of said trapezoid-shaped luminous intensity distribution.

22. A method according to claim 21, wherein all points of the area to be exposed on said substrate are exposed at least one time by respective slope portions at opposite sides of said trapezoid-shaped luminous intensity distribution.

23. A method according to claim 22, wherein said trapezoid-shaped luminous intensity distribution is determined so that a symmetry of two slope portions on lateral sides of said trapezoid-shaped luminous intensity distribution is less than or equal to an allowable value which is determined based on a minimum number of exposure pulses.

24. A method according to claim 21, wherein the luminous intensity distribution of the predetermined illumination area on the substrate is shaped to be a trapezoid by defocussing a field stop for illuminating the predetermined illumination area in a predetermined amount from a position optically conjugate to an exposure surface of the substrate.

25. A method according to claim 21, wherein said trapezoid-shaped luminous intensity distribution is determined so that a symmetry of two slope portions on lateral sides of said trapezoid-shaped luminous intensity distribution is less than or equal to an allowable value which is determined based on a minimum number of exposure pulses.

26. An exposure method in which a pattern of a mask is successively exposed on a photosensitive substrate by synchronously scanning the mask and the photosensitive substrate with respect to a predetermined illumination area illuminated with pulsed light from a pulsed light source, wherein:
    luminous intensity distribution of the predetermined illumination area on said substrate in a scan direction is shaped to be a trapezoid, and all points of an area to be exposed on said substrate are exposed at least one time by slope portions of said trapezoid-shaped luminous intensity distribution.

27. A method according to claim 26, wherein the luminous intensity distribution of the predetermined illumination area on the substrate is shaped to be a trapezoid by defocussing a field stop for illuminating the predetermined illumination area in a predetermined amount from a position optically conjugate to an exposure surface of the substrate.

28. A method according to claim 26, wherein said trapezoid-shaped luminous intensity distribution is determined so that a symmetry of two slope portions on lateral sides of said trapezoid-shaped luminous intensity distribution is less than or equal to an allowable value which is determined based on a minimum number of exposure pulses.

29. A semiconductor device manufacturing method in which a pattern of a mask is successively exposed on a photosensitive substrate by synchronously scanning the mask and the photosensitive substrate with respect to a predetermined illumination area illuminated with pulsed light from a pulsed light source, wherein:
    luminous intensity distribution of the predetermined illumination area on said substrate in a scan direction is shaped to be a trapezoid, and all points of an area to be exposed on said substrate are exposed at least one time by slope portions of said trapezoid-shaped luminous intensity distribution.

30. A method according to claim 29, wherein the luminous intensity distribution of the predetermined illumination area on the substrate is shaped to be a trapezoid by defocussing a field stop for illuminating the predetermined illumination area in a predetermined amount from a position optically conjugate to an exposure surface of the substrate.

31. A method according to claim 29, wherein said trapezoid-shaped luminous intensity distribution is determined so that a symmetry of two slope portions on lateral sides of said trapezoid-shaped luminous intensity distribution is less than or equal to an allowable value which is determined based on a minimum number of exposure pulses.

* * * * *

UNITED STATES PATENT AND TRADEMARK OFFICE
CERTIFICATE OF CORRECTION

PATENT NO. : 5,777,724
DATED : July 7, 1998
INVENTOR(S) : Kazuaki SUZUKI

It is certified that error appears in the above-identified patent and that said Letters Patent is hereby corrected as shown below:

In Claim 1:
  line 6, delete "relatively";
  line 19, "Nmin" should read -- $N_{min}$ --.

In Claim 2:
  line 3, delete in its entirety;
  line 4, should read -- $|(1/\Delta D_1) - (1/\Delta D_2)| \leq 2N_{min}[U_{scan}]_{max}/\Delta D_{12}$ --.

In Claim 4:
  line 12, should read -- $\Delta D_{12} \geq \dfrac{|\Delta X|}{2N_{min}[U_{bias}]_{max}}$ --.

In Claim 6:
  line 4, delete "relatively".

In Claim 8:
  line 9, should read -- $\Delta D_{12} \geq \dfrac{|\Delta X|}{2N_{min}[U_{bias}]_{max}}$ --.

UNITED STATES PATENT AND TRADEMARK OFFICE
CERTIFICATE OF CORRECTION

PATENT NO. : 5,777,724
DATED : July 7, 1998
INVENTOR(S) : Kazuaki Suzuki

It is certified that error appears in the above-identified patent and that said Letters Patent is hereby corrected as shown below:

In Claim 15:
  line 2, "an-integrated" should read --an integrated--.

In Claim 21:
  line 7, delete "a".

Signed and Sealed this

Twelfth Day of December, 2000

Attest:

Attesting Officer

Q. TODD DICKINSON
Director of Patents and Trademarks